United States Patent [19]

Scott

[11] 4,099,263

[45] Jul. 4, 1978

[54] BUFFERING FOR AN $I^2L$ MEMORY CELL

[75] Inventor: Paul Howard Scott, Tempe, Ariz.

[73] Assignee: Motorola Inc., Schaumburg, Ill.

[21] Appl. No.: 738,779

[22] Filed: Nov. 4, 1976

[51] Int. Cl.[2] .............................................. G11C 11/40

[52] U.S. Cl. .................................... 365/155; 307/238; 365/206

[58] Field of Search ..................... 340/173 R, 173 FF; 307/214, 303, 238; 365/154, 155, 242, 189

[56] References Cited

U.S. PATENT DOCUMENTS 3,986,178 10/1976 McElroy et al. ................ 340/173 R

*Primary Examiner*—Bernard Konick

*Assistant Examiner*—Donald McElheny

*Attorney, Agent, or Firm*—Joe E. Barbee

[57] ABSTRACT

A memory cell having input and output buffering. Input buffering is provided by connecting the injector input of an integrated injection logic ($I^2L$) gate to the data input line of the memory cell and by connecting the injector input of the input gates of the memory cell to the write enable line. In order to enter data into the memory cell, the input gates must be energized via the injector input. Output buffering is provided by placing another integrated injection logic gate between the memory cell output and the data output line. The injector input of the another gate is connected to a read select line thereby permitting information contained within the memory cell to be read out to the data output line whenever the read select line connected to the injector input is enabled.

7 Claims, 3 Drawing Figures

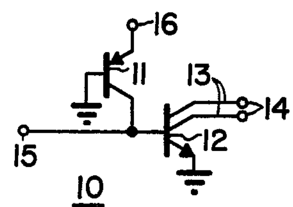
FIG. 1
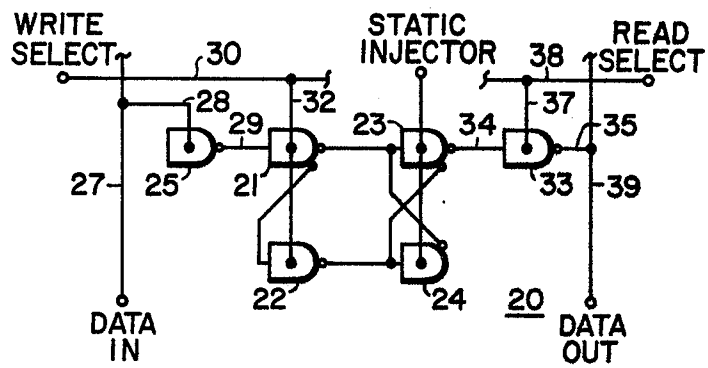
FIG. 2
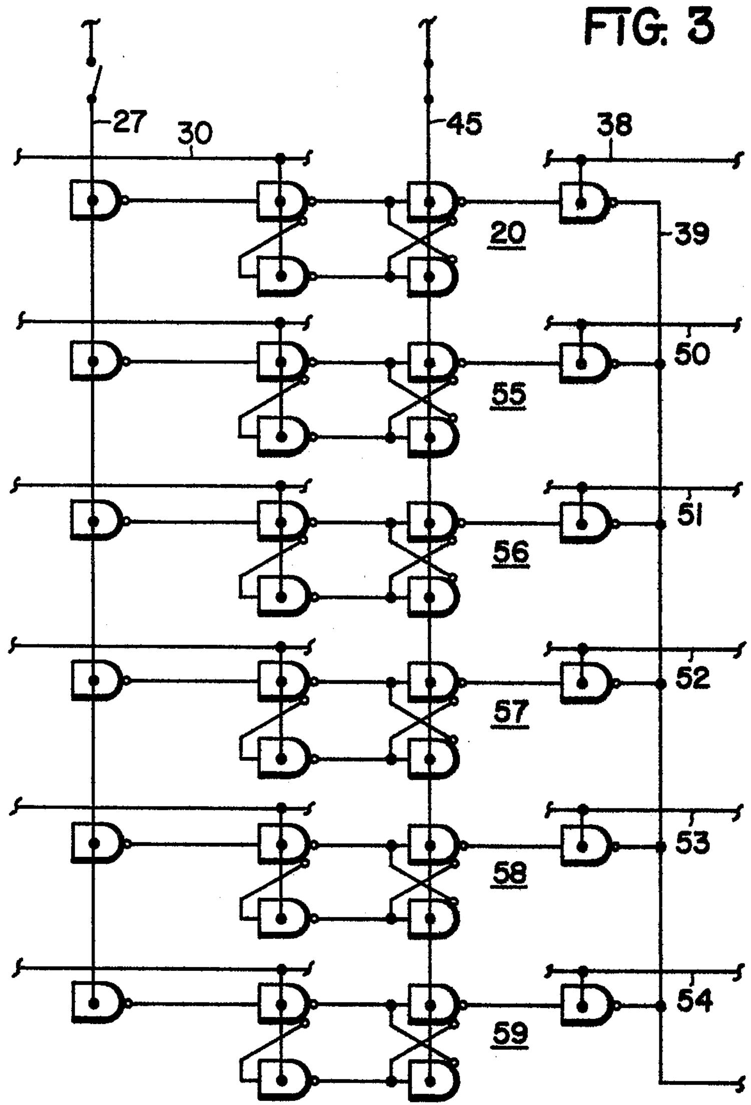

BUFFERING FOR AN $I^2L$ MEMORY CELL

BACKGROUND OF THE INVENTION

This invention relates to data memories, and more particularly, relates to circuitry and method for providing input and output buffering for a memory cell by using integrated injection logic ($I^2L$).

An $I^2L$ memory cell was disclosed in an article by S. K. Wiedmann appearing in IEEE Journal of Solid State Circuits in October, 1973 on page 332. When many such cells are used in a memory it becomes necessary to provide some isolation or buffering between cells, otherwise, data appearing on the input terminal may very well disturb contents of other cells within the memory. Also output buffering must be provided or other cells in the memory may interfere with proper reading of a desired cell. A resistor or a diode in series with the input gate of the memory cell and the data input line could be used to provide the desired buffering. However, since many $I^2L$ memory cells plus other interface circuitry and registers can all be manufactured on a single integrated circuit chip it becomes overly costly in the amount of chip area consumed just to separately isolate the resistors or the diodes on the semiconductor chip. In addition, since the resistors must be large in ohmic value to adequately isolate the cells they would require a relatively large area of the semiconductor chip.

In view of the foregoing, it should now be understood that it would be desirable to provide an improved isolation scheme for the memory cell that would solve the above and other problems.

Accordingly, one of the objects of the present invention is to provide an improved memory cell that will not cause nor suffer from current hogging effects with adjacent cells.

Another object of the invention is to provide a memory having cells that are adequately buffered so that noise on an output data line does not change the information stored in the cell.

A further object of the invention is to provide an improved memory wherein each cell of the memory is essentially buffered by at least two gates.

Yet another object of the present invention is to provide an improved memory using $I^2L$ circuitry and requiring a reduced die size since one metal line can be used to go to the inputs of all the individual cells of the memory.

SUMMARY OF THE INVENTION

In carrying out the above and other objects of the invention in one form, I provide an improved memory cell for use in an $I^2L$ memory. One illustrated $I^2L$ memory cell has an integrated injection logic gate placed in series between the input of the memory cell and the data input line. The data input line is connected to the injector input of the logic gate. The output of the logic gate is connected to the input of the memory cell. The input gate of the memory cell has its injector input connected to the write enable line of the memory. Therefore, whenever it is desired to enter data into the memory cell the write enable line is enabled and any information on the data input line is entered into the memory cell. Since each cell of the memory has an integrated injection logic gate in series with its input the information on the data input line will not be entered into other cells unless the write enable line associated with the other cells is enabled. The output of the memory cell can also have an integrated injection logic ($I^2L$) gate in series with this output and the data output line. The output of the memory cell is connected to the input of the logic gate and the output of the logic gate is connected to the data output line. The injector input of the logic gate is connected to a read select line. When it is desired to read data out of the memory cell the read select line is enabled thereby enabling the logic gate to pass any information from within the memory cell to the data output line. The logic gate in series with the output of the memory cell prevents any noise that may appear on the data output line from irradicating or modifying the data stored within the memory cell.

The subject matter which I regard as my invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 is a schematic representation of an $I^2L$ gate;

FIG. 2 is a logic diagram illustrating an embodiment of the invention in one form thereof; and FIG. 3 illustrates several memory cells as they would be interconnected to form a portion of a memory.

The exemplifications set out herein illustrate the preferred embodiments of the invention in one form thereof, and such exemplifications are not to be construed as limiting in any manner.

DESCRIPTION OF THE PREFERRED EMBODIMENTS

In FIG. 1 there is illustrated in schematic form an integrated injection logic ($I^2L$) gate 10. Logic gate 10 has a PNP transistor 11 and an NPN transistor 12. The collector of transistor 11 and the base of transistor 12 is a common P type region of a semiconductor chip while the base of transistor 11 and the emitter of transistor 12 is a common N type region of the same semiconductor chip. Such a construction of a semiconductor chip is shown in U.S. Pat. No. 3,736,477 which issued to Berger et al and is also shown in an article appearing on page 34, of volume 20, No. 4, of the Feb. 29, 1975 issue of EDN (formerly Electrical Design News). Transistor 12 can have split collectors 13 thereby providing a logic gate 10 having multiple outputs. Injector input terminal 16 of logic gate 10 is normally connected to a current source, therefore, when a logic high is applied to input terminal 15 transistor 12 becomes a current sink by conducting heavily thereby causing output terminals 14 to appear to be essentially at ground reference. When a logic low or zero is placed on input terminal 15 current from transistor 11 is directed from base of transistor 12 to an external current sink thus preventing transistor 12 from conducting and transistor 12 will no longer serve as a current sink for the circuitry connected to output terminals 14. Accordingly, logic gate 10 is commonly called an inverting gate. Although transistor 12 is shown with only two collectors 13 it will be understood by those persons skilled in the art that transistor 12 can have more than two collectors.

FIG. 2 illustrates a memory cell or register 20 having $I^2L$ gates 21, 22, 23, and 24. Gates 21 and 22 are the input gates for register 20 while gates 23 and 24 form an R-S latch which performs the memory function. An $I^2L$ gate 25 is shown in series between the input of memory cell 20 and data input line 27. However, it will be noted that the conventional input for $I^2L$ gate 25 is not used. Instead, injector input 28 is connected to data input line 27. The output of logic gate 25 is fed to the input of logic gate 21 via line 29. In order for data on data input line 27 to be stored in the RS latch, logic gates 21 and 22 must be enabled by the proper command on write select or write enable line 30. Write enable line 30 is connected to injector input 32 of logic gates 21 and 22. The output of the RS flip-flop or latch formed by gates 23 and 24 is connected to the input of logic gate 33 by way of line 34. Logic gate 33 will not pass any information unless enabled by the proper command appearing on read select line 38 which is connected to injector input 37 of logic gate 33. The output of logic gate 33 is connected to data output line 39 by way of line 35.

A logic "1" or high on data input line 27 will appear as a logic low on the output of gate 25. However, the signal in logic gate 25 is not processed through logic gate 21 until gate 21 is enabled by a write enable signal on line 30. Although data input line 27 may be connected to many other memory cells the information appearing on data input line 27 will only enter the memory cell which is enabled by the proper write enable signal. Since only one memory cell within a memory array is connected to both data input line 27 and write enable line 30, any information on data input line 27 will not enter the other memory cells when only line 30 is activated. Therefore, the information on data input line 27 does not become loaded down by other cells connected to input line 27. This arrangement eliminates the requirement of large $I^2L$ fanouts usually associated with large parallel arrays. The PNP transistor in the $I^2L$ gate is used for isolation and the NPN is used to compensate for the difference in current due to injector current sharing.

Having $I^2L$ gate 33 on the output of the memory cell 20 provides buffering or isolation between the memory cell and data output line 39. Such an array prevents any signals or noise on data output line 39 from interferring with or modifying the data stored within memory cell 20. The use of the memory cell as shown in FIG. 2 and having logic gates 25 and 33 allows the use of injector selection instead of having to use multiple metal lines on the integrated circuit chip to serve high fanout lines in $I^2L$ register arrays. This permits the use of reduced die size due to the elimination of multiple signal routing that would otherwise be required.

An injector current switch useful in injector selection by switching the injector inputs of gates 21 and 22 is disclosed in my co-pending application entitled "$I^2L$ Injector Current Source" Ser. No. 738,778 filed on Nov. 4, 1976 now U.S. Pat. No. 4,075,508.

FIG. 3 illustrates one column of a memory array having six memory cells. Data input line 27 provides input information for all six memory cells while data output line 39 provides an output connection for all the cells. Memory cell 20 has a write enable line 30 connected to it which could also be connected to other memory cells within the same row as memory cell 20. Read enable line 38 is connected to memory cell 20, and of course line 38 could also be connected to other cells within the same row as memory cell 20. Cells 55, 56, 57, 58, and 59 also have write enable input lines 40, 41, 42, 43, 44, respectively. Each cell 55, 56, 57, 58, and 59 also respectively has a separate read enable line 50, 51, 52, 53, and 54. Static injector line 45 is connected to injector inputs for each one of the cells 20, 55–59. The signal on static injector line 45 is continuously applied to the gates forming the RS latches for the cells and is not switched on and off as it is for the other cells which are used to provide isolation.

It should by now be appreciated that I have provided an improved memory wherein the output cell of each memory cell is buffered so that noise on the data output line does not change the state of the memory cell. The input of each memory cell is buffered by two gates which provide positive entering of data into a desired cell and also prevents current loading effects from one cell to the next when an attempt is made to enter data into a cell. An additional benefit is that the die size for the integrated circuit chip is reduced in size since only one metal line goes to the data inputs of all the memory cells within one column and isolation is provided by relatively small space consuming $I^2L$ gates. If it were not for the input isolation provided, it would be necessary to run many input data lines, especially in a large memory array.

Consequently, while in accordance with the Patent Statutes, I have described what at present are considered to be the preferred forms of my invention. It will be obvious to those skilled in the art that numerous changes and modifications may be made herein without departing from the true spirit and scope of the invention, and it is therefore aimed in the following claims to cover all such modifications.

What I claim as new and desire to secure by Letters Patents of the United States is:

1. A semiconductor register cell having a plurality of integrated injection logic gates, at least one data input line, and at least one write line, comprising: a first integrated injection logic gate having an injector input and an output, the injector input being coupled to the data input line; a second integrated injection logic gate having an injector input, a signal input and an output, the signal input being coupled to the output of the first integrated injection logic gate, and the at least one write line being coupled to the injector input of the second logic gate to permit information on the at least one data input line to enter the register cell when current on the write line enables the second logic gate.

2. The register cell of claim 1 further having a third integrated injection logic gate having an injector input coupled to the write line and which is also enabled by the write line.

3. The register cell of claim 1 further having another integrated injection logic gate having an input, an output and an injector input, the injector input being coupled to a read enable line, the another logic gate being for reading out information in the register cell when current on the injector input of the another logic gate enables the another logic gate.

4. A register cell having a plurality of integrated injection logic gates, comprising: a first integrated injection logic gate having an injector input coupled to a data input line for the register cell; and a second logic gate having an injector input coupled to a write enable line for the register cell to allow data to enter the register cell from the data input line through the injector input of the first logic gate when the write enable line is energized.

5. The register cell of claim 4 further comprising a third integrated injection logic gate having an injector input coupled to a read select line so that data in the register cell can be read out whenever the read select line is energized.

6. A data storage memory having a plurality of storage cells and at least one data input line, a plurality of write enable lines, a plurality of read enable lines, and at least one data output line, comprising: a first integrated injection logic gate having an injector input and an output, the output being coupled to one of the plurality of storage cells and the injector input being coupled to the at least one data input line; a second integrated injection logic gate having at least an injector input and an output, the output being coupled to the at least one data output line and the injector input being coupled to one of the plurality of read enable lines so that when the one of the plurality of read enable lines is activated information contained within the one of the plurality of storage cells can be read out; an input gate of the one of the plurality of storage cells having an injector input coupled to one of the plurality of write enable lines whereby when that write enable line is activated information on the at least one data input line is entered in the one of the plurality of storage cells, the first and the second integrated injection logic gates being duplicated for each of the plurality of storage cells.

7. A method of buffering an input and an output of a storage cell of a memory having a plurality of storage cells, comprising: coupling an injector input of an integrated injection logic gate to a data input line of the memory; coupling an injector input of an input integrated injection logic gate to a write enable line of the memory so that when the write enable line is enabled any information on the data input line can enter the storage cell; coupling a third integrated injection logic gate to an output of the storage cell; providing enabling to the third logic gate by enabling an injector input of the third logic gate; and coupling an output of the third logic gate to a data out line of the memory so that when the injector input of the third logic gate is enabled data in the storage cell can be read out.

* * * * *